(12) United States Patent
Ma et al.

(10) Patent No.: US 11,130,674 B2
(45) Date of Patent: Sep. 28, 2021

(54) INTEGRATED PACKAGE STRUCTURE FOR MEMS ELEMENT AND ASIC CHIP AND METHOD FOR MANUFACTURING THE SAME

(71) Applicants: J-METRICS TECHNOLOGY Co., Ltd., Shenzhen (CN); Peking University Shenzhen Graduate School, Shenzhen (CN)

(72) Inventors: Sheng-Lin Ma, Shenzhen (CN); Dan Gong, Shenzhen (CN); Yi-Hsiang Chiu, Shenzhen (CN)

(73) Assignees: J-METRICS TECHNOLOGY CO., LTD., Shenzhen (CN); PEKING UNIVERSITY SHENZHEN GRADUATE SCHOOL, Shenzhen (CN)

( * ) Notice: Subject to any disclaimer, the term of this patent is extended or adjusted under 35 U.S.C. 154(b) by 0 days.

(21) Appl. No.: 16/740,633

(22) Filed: Jan. 13, 2020

(65) Prior Publication Data
US 2020/0262700 A1 Aug. 20, 2020

(30) Foreign Application Priority Data
Feb. 19, 2019 (CN) .......................... 201910124346.5

(51) Int. Cl.
*B81C 1/00* (2006.01)
*B81B 7/00* (2006.01)

(52) U.S. Cl.
CPC ........ *B81C 1/00238* (2013.01); *B81B 7/0006* (2013.01); *B81B 2201/0271* (2013.01);
(Continued)

(58) Field of Classification Search
CPC ........ B81C 1/00238; B81C 2203/0792; B81C 2201/0125; B81C 2201/0159;
(Continued)

(56) References Cited

U.S. PATENT DOCUMENTS

2013/0278610 A1* 10/2013 Stephanou .............. H01P 1/208
345/501
2014/0042562 A1* 2/2014 Chu .................... G01P 15/0802
257/415

(Continued)

OTHER PUBLICATIONS

Sun et al. ("A novel double-side CMOS-MEMS post processing for monolithic sensor integration," IEEE 21st International Conference on Micro Electro Mechanical Systems, pp. 90-93, 2008) (Year: 2008).*

*Primary Examiner* — Yasser A Abdelaziez
(74) *Attorney, Agent, or Firm* — Muncy, Geissler, Olds & Lowe, P.C.

(57) ABSTRACT

An integrated package method for MEMS element and ASIC chip includes forming a re-layout layer on a front surface of an ASIC wafer; coating an organic compound layer on the re-layout layer and applying a lithography process to the organic compound layer to from a microcavity array; aligning and bonding an electrode connection pad layer on a front surface of an MEMS element with the microcavity array to form a closed cavity structure; thinning and exposing a silicon substrate on a back surface of the MEMS element to a desired thickness; applying the lithographic process on the MEMS element to expose the electrode connection pad layer and an electrical contact area of the re-layout layer; and manufacturing a metal connection member connected to the electrode connection pad layer and the electrical contact area. An integrated package structure for MEMS element and ASIC chip is also provided.

9 Claims, 3 Drawing Sheets

(52) U.S. Cl.
CPC ..... *B81B 2207/012* (2013.01); *B81B 2207/07* (2013.01); *B81C 2201/0125* (2013.01); *B81C 2201/0159* (2013.01); *B81C 2203/032* (2013.01); *B81C 2203/054* (2013.01); *B81C 2203/0792* (2013.01)

(58) Field of Classification Search
CPC ........ B81C 2203/032; B81C 2203/054; B81B 7/0006; B81B 2201/0271; B81B 2207/012; B81B 2207/07
See application file for complete search history.

(56) References Cited

U.S. PATENT DOCUMENTS

| | | | |
|---|---|---|---|
| 2014/0145244 A1* | 5/2014 | Daneman | B81C 3/001 257/254 |
| 2015/0145076 A1* | 5/2015 | Kim | B81C 1/0023 257/415 |
| 2017/0323853 A1* | 11/2017 | Hu | H01L 23/5386 |
| 2018/0107854 A1* | 4/2018 | Tsai | B06B 1/067 |
| 2018/0148320 A1* | 5/2018 | Yang | B81C 1/00293 |

* cited by examiner

INTEGRATED PACKAGE STRUCTURE FOR MEMS ELEMENT AND ASIC CHIP AND METHOD FOR MANUFACTURING THE SAME

CROSS-REFERENCE TO RELATED APPLICATION

This non-provisional application claims priority under 35 U.S.C. § 119(a) to Patent Application No. 201910124346.5 filed in China, P.R.C. on Feb. 19, 2019, the entire contents of which are hereby incorporated by reference.

BACKGROUND

Technical Field

The instant disclosure relates to microelectromechanical systems (MEMS) technology, in particular, to an integrated package structure for MEMS element and application-specific integrated circuit (ASIC) chip and method for manufacturing the same.

Related Art

The aluminum nitride (AlN) MEMS element is a sensor or an actuator using AlN as the piezoelectric materials. The AlN MEMS elements are developed in a trend of minimization and small-scale integration, in which not only the size reduction and the performance improvement are pursued but the cost reduction is also concerned. The AlN materials provide proper heat conduction property, higher dielectric constant, and are compatible with the complementary metal oxide semiconductor (CMOS) manufacturing process. The AlN MEMS elements not only have better electrical property, mechanical property, and optical transmission property, but also can be manufactured with simpler processes and lower costs. Hence, the AlN MEMS elements are widely used in industrial fields, medical science fields, and the like. Currently, commercial applications for the AlN MEMS elements include thin film bulk acoustic wave oscillators, ultrasonic sensors, piezoelectric transducers, and the like.

For compact and complicated AlN MEMS elements, movable components inside the elements have to be protected to ensure the high performance of the elements. Moreover, in order to prevent the components from long-time contacting complicated working environments, subsequent integrated package processes are also important. The integrated package technical solutions currently known to the inventor(s) are described as below. An American company, InvenSense, provided a MEMS wafer scale vacuum package technical solution in MEMS-IC monolithic integration, in which a thin film bulk acoustic wave element and an ultrasonic sensor are provided as the substrate, an ASIC signal processing IC is stacked on the substrate, and the interconnection is achieved using the through-silicon via (TSV) in the package structure for leading out the signals. Recently, enterprises and research institutes mostly adopt the Post-CMOS monolithic integration for subsequent mass productions. After general IC manufacturing processes are completed, MEMS elements are manufactured using MEMS micro-machines, thereby accomplishing the monolithic integration MEMS system. In 1960, the IBM company developed the flip chip package technology. In general, a solder point array is manufactured on the front surface of the chip as input and output terminals, and then the chip is flipped and soldered on the package substrate with applying filler organic materials to steady the soldering and bonding process.

SUMMARY

However, the wafer scale vacuum package technical solution based on the TSV technology is complicated and has a great influence for IC designs. As the scale down speed for IC technology is much faster than the scale down speed for MEMS technology, requiring the area of the ASIC to be in consistent with the MEMS chip results material waste and increased costs. On the other hand, although the Post-CMOS monolithic integration technical solution has fewer requirements for CMOS manufacturing processes, CMOS circuits are affected greatly when the AlN MEMS element undergoes high-temperature processing procedures. The flip chip technology cannot make the AlN MEMS element to form a closed cavity structure.

In view of this, one object according one or some embodiments of the instant disclosure is to overcome the aforementioned issue(s) known to the inventor(s). According to one or some embodiments of the instant disclosure, an integrated package structure for MEMS element and ASIC chip and an integrated package method for MEMS element and ASIC chip are provided, so that the MEMS element with a closed cavity structure configuration can be implemented and the MEMS element can be electrically connected to the ASIC wafer.

According to one or some embodiments, an integrated package method for MEMS element and ASIC chip adopt following technical solutions.

According to one or some embodiments, an integrated package method for MEMS element and ASIC chip includes the Step (1) to the Step (6).

Step (1): applying a lithographic process on an ASIC wafer to deposit and form a re-layout layer; Step (2): spin-coating an organic compound layer on the re-layout layer to form a bonding layer, and applying the lithography process to the bonding layer to form a microcavity array; Step (3): aligning and bonding an electrode connection pad layer on a front surface of an MEMS element with the microcavity array to form a closed cavity structure; Step (4): thinning and polishing a silicon substrate on a back surface of the MEMS element being bonded to a desired thickness; Step (5): applying the lithographic process on the MEMS element to form a connection portion outwardly protruding from the electrode connection pad layer, and forming an open hole on the bonding layer to expose an electrical contact area of the re-layout layer; and Step (6): manufacturing a metal connection member on the connection portion and the bonding layer so as to allow the electrode connection pad layer to be electrically connected to the electrical contact area.

In one or some embodiments, the MEMS element is an ultrasonic sensor, a bulk acoustic wave sensor, or a piezoelectric energy storage device.

In one or some embodiments, in the MEMS element, the silicon substrate is stacked on an oxidation layer, the oxidation layer is stacked on a lower electrode layer, the lower electrode layer is stacked on a piezoelectric layer, the piezoelectric layer is stacked on an upper electrode layer, the upper electrode layer is stacked on a surface passivation layer, and the surface passivation layer is stacked on the electrode connection pad layer.

In one or some embodiments, the re-layout layer is an aluminum (Al) layer, a copper (Cu) layer, or an aluminum copper alloy (Al/Cu) layer.

In one or some embodiments, the bonding layer is made of benzocyclobutene (BCB).

In one or some embodiments, the closed cavity structure is a vacuum closed cavity.

In one or some embodiments, in the step of thinning and polishing a silicon substrate on a back surface of the MEMS element being bonded to a desired thickness, the desired thickness is less than or equal to 10 μm.

In one or some embodiments, the electrode connection pad layer is an aluminum (Al) layer, a copper (Cu) layer, or an aluminum cooper alloy (Al/Cu) layer.

In one or some embodiments, the metal connection member is a solder pad, a lead wire, or a solder ball.

Further, an integrated package structure for MEMS element and ASIC chip is provided. The integrated package structure comprises an ASIC wafer and an MEMS element. The integrated package structure further comprises a re-layout layer, a bonding layer, and a metal connection member. The re-layout layer is on a surface of the ASIC wafer and comprises an electrical contact area. The bonding layer is on a surface of the re-layout layer and comprises a microcavity array and an open hole. The open hole corresponds to the electrical contact area. The electrode connection pad layer of the MEMS element and the microcavity array are aligned and bonded with each other to from a closed cavity structure. A connection portion is outwardly protruding from the electrode connection pad layer. The metal connection layer is electrically connected to the connection portion and the electrical contact area.

As above, as compared with the technical solutions known to the inventor(s), the integrated package method and structure according one or some embodiments of the instant disclosure have following advantages. 1. The technical features according to one or some embodiments of the instant disclosure allow the MEMS element to form a closed cavity structure and to connect to the ASIC wafer electrically, thereby preventing from the foregoing integrated package problems due to areas of the ASIC wafer and the MEMS chip being different, and thereby further reducing the overall volume of the MEMS element, achieving flip chip bonding process, and improving the defect-free rate of the MEMS element. Hence, for the integrated package trend in the future, the technical solutions according to one or some embodiments of the instant disclosure provide a convenient way for subsequent testing and application of the MEMS element. 2. According to one or some embodiments of the instant disclosure, the organic compound bonding technique is applied (preferably in one embodiment, the organic compound is BCB), thereby resulting in a lower bonding temperature, better thermal, chemical, and mechanical stabilities, and proper compatibility with integrated circuit manufacturing process.

BRIEF DESCRIPTION OF THE DRAWINGS

The disclosure will become more fully understood from the detailed description given herein below for illustration only, and thus not limitative of the disclosure, wherein.

DETAILED DESCRIPTION

Figure 1:
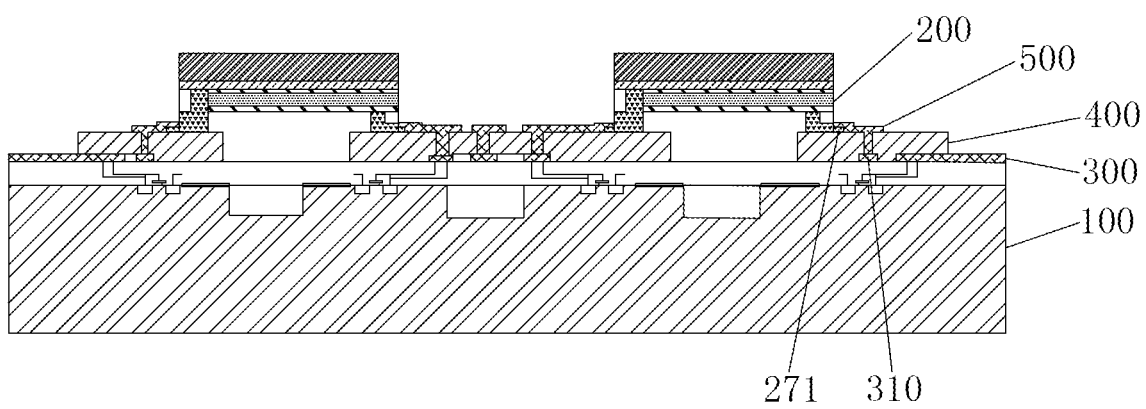
FIG. 1 illustrates a cross-sectional view of an integrated package structure according to an exemplary embodiment of the instant disclosure.

The instant disclosure will be further described in detail below with reference to the accompanying drawings and embodiments. The drawings of the present invention are merely illustrative for easier understanding of the instant disclosure, and the specific proportions thereof can be adjusted according to design requirements. The above-described relative relationship of the elements in the drawings described herein will be understood by those skilled in the art to refer to the relative positions of the members, and therefore, the same members may be turned over and the like, which are all within the scope of the instant disclosure.

As shown in FIG. 1, an integrated package structure for MEMS element and ASIC chip according to an exemplary embodiment of the instant disclosure is illustrated. The integrated package structure comprises an ASIC wafer 100, an MEMS element 200, a re-layout layer 300, a bonding layer 400, and a metal connection member 500. The re-layout layer 300 is on a surface of the ASIC wafer 100 and comprises an electrical contact area. The re-layout layer 300 is an aluminum (Al) layer, a copper (Cu) layer, or an aluminum copper alloy layer (Al/Cu) layer. The bonding layer 400 is on a surface of the re-layout layer 300 and comprises a microcavity array 410 and an open hole. The open hole corresponds to the electrical contact area. The bonding layer 400 is made of benzocyclobutene (BCB) or other organic compound(s).

Figure 6:
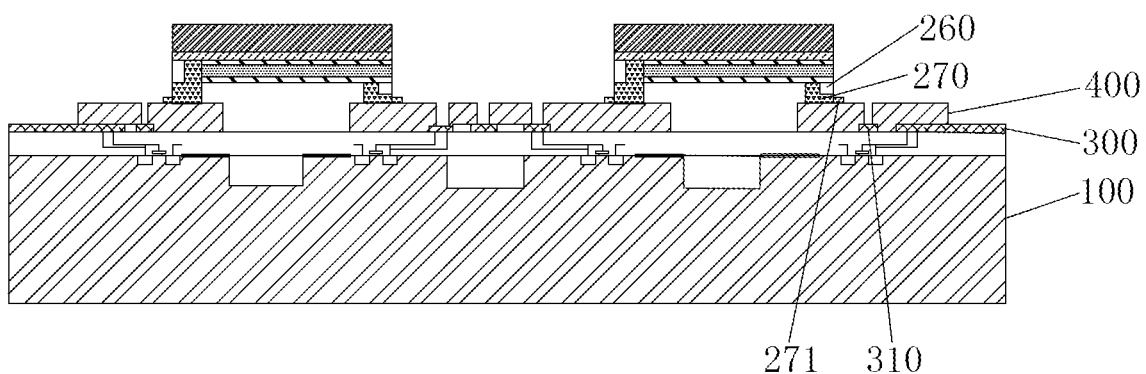
FIG. 6 illustrates a cross-sectional view showing a step of the integrated package method of the exemplary embodiment, where the step is forming a connection portion.

Please refer to FIG. 6. The electrode connection pad layer 270 of the MEMS element 200 is aligned and bonded with the microcavity array 410 of the bonding layer 400 to form a closed cavity structure. A connection portion 271 is outwardly protruding from the electrode connection pad layer 270. The closed cavity structure is a vacuum closed cavity. The electrode connection pad layer 270 is an aluminum (Al) layer, a copper (Cu) layer, or an aluminum copper alloy (Al/Cu) layer. The metal connection member 500 is electrically connected to the connection portion 271 and the electrical contact area 310. The metal connection member 500 is a solder pad, a lead wire, or a solder ball.

The MEMS element 200 is a multi-layer thin film stacked structure array, and the MEMS element 200 sequentially comprise a silicon substrate 210, an oxidation layer 220, a lower electrode layer 230, a piezoelectric layer 240, an upper electrode layer 250, a surface passivation layer 260, and an electrode connection pad layer 270. A thickness of the silicon substrate 210 is about in a range from 200 to 500 μm. The lower electrode layer 230 may be selected from a group consisting of molybdenum (Mo), aluminum (Al), and copper (Cu). The piezoelectric layer 240 may be made of aluminum nitride (AlN), and a thickness of the piezoelectric layer 240 may be in a range from 0.1 to 5 mm. The upper electrode layer 250 may be selected from a group consisting of molybdenum (Mo), aluminum (Al), and copper (Cu). The surface passivation layer 260 may be made of silicon dioxide ($SiO_2$). The electrode connection pad layer 270 may be an aluminum (Al) layer, a copper (Cu) layer, or an aluminum copper alloy (Al/Cu) layer. However, the MEMS element 200 herein is provided for illustrative purposes, but not limitations to the embodiments of the instant disclosure. The MEMS element 200 may be an ultrasonic sensor, a bulk acoustic wave sensor, a piezoelectric energy storage device, or the like.

Preferably, in some embodiments, after the package procedure is completed, the thickness of the silicon substrate 210 is not greater than 10 mm. The lower electrode layer 230 adopts Mo, the piezoelectric layer 240 adopts AlN, and the thickness of the piezoelectric material layer is in a range from 0.1 to 5 mm. The upper electrode layer 250 adopts Al. The surface passivation layer 260 and the oxidation layer 220 adopt silicon dioxide. The electrode connection pad layer 270 adopts AlN. The circuit in the ASIC wafer 100 is a signal processing circuit corresponding to the MEMS element 200.

Figure 2:
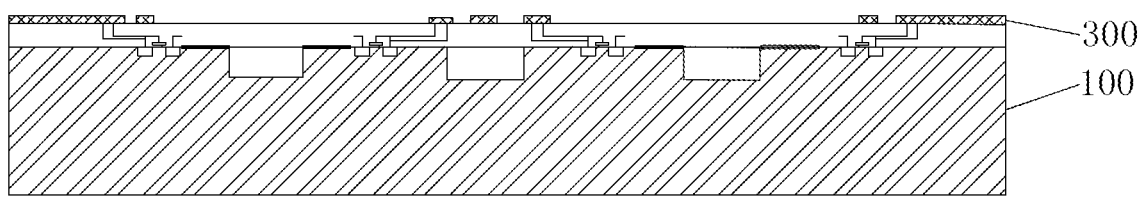
FIG. 2 illustrates a cross-sectional view showing a step of an integrated package method according to an exemplary embodiment of the instant disclosure, where the step is forming a re-layout layer.

Please refer to FIG. 2. According to one or some embodiments of the instant disclosure, an integrated package method for MEMS element and ASIC chip is also provided. The integrated package method may be accomplished in chip or wafer scales. The integrated package method mainly includes following step (1) to step (6).

Figure 3:
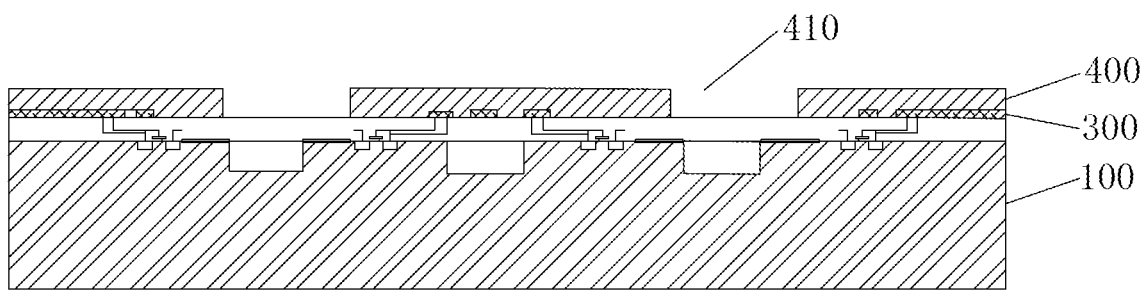
FIG. 3 illustrates a cross-sectional view showing a step of the integrated package method of the exemplary embodiment, where the step is forming a bonding layer.

Step (1): as shown in FIG. 2, a re-layout layer 300 is manufactured on the ASIC wafer 100 so as to re-layout the electrode connection pad layer 270 of the MEMS element 200, and the re-layout layer 300 is provided as an electrical contact area for components subsequently stacked on the electrode connection pad layer 270. Step (2): as shown in FIG. 3, by spin-coating, an organic compound layer is manufactured on the re-layout layer 300 to from a bonding layer 400, and a lithography process is applied to the bonding layer 400 to form a microcavity array 410.

Figure 4:
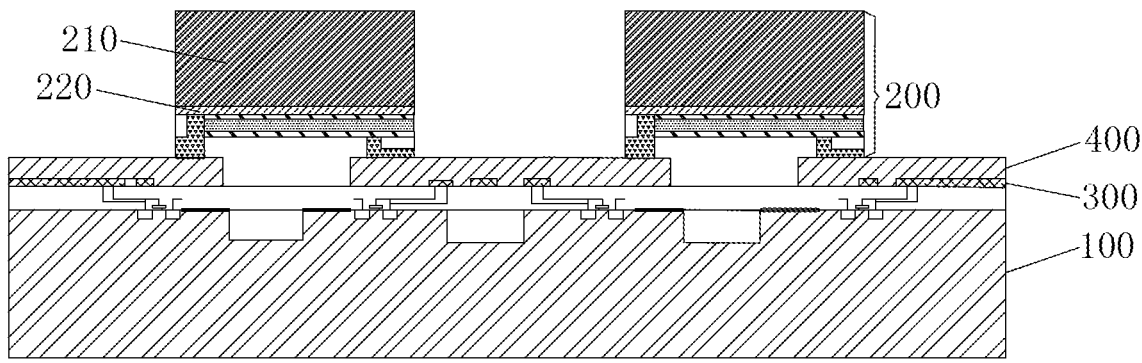
FIG. 4 illustrates a cross-sectional view showing a step of the integrated package method of the exemplary embodiment, where the step is bonding to form a closed cavity structure.
Figure 5:
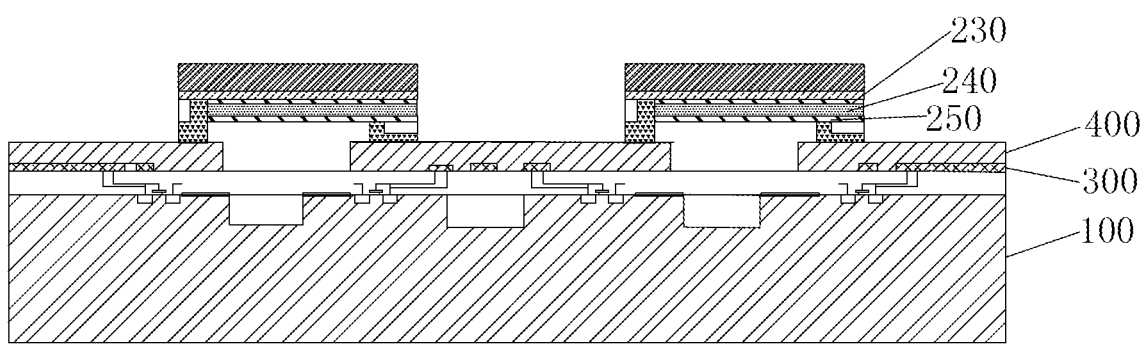
FIG. 5 illustrates a cross-sectional view showing a step of the integrated package method of the exemplary embodiment, where the step is thinning and polishing.

Step (3): as shown in FIG. 4, for the MEMS element 200, in a wafer to wafer or a chip to wafer manner, the electrode connection pad layer 270 of the MEMS element 200 and the microcavity array 410 are aligned with each other, and are bonded with each other in a vacuum condition to form a closed cavity structure. Step (4): as shown in FIG. 5, the silicon substrate 210 of the MEMS element 200 which is already bonded to the ASIC wafer 100 is thinned and polished to a desired thickness, thereby ensuring the performance of the MEMS element 200.

Step (5): as shown in FIG. 6, an etching process is applied to expose a portion of the electrode connection pad layer 270 on the front surface of the MEMS element 200 to form a connection portion 271 outwardly protruding from the electrode connection pad layer 270, and an open hole is formed on the bonding layer 400 to expose the electrical contact area 310 of the re-layout layer 300. The etching applied to the silicon substrate 210 of the MEMS element 200 may be the deep reactive-ion etching (DRIE). The etching applied to the oxidation layer 220 and the bonding layer 240 may be reactive-ion etching (RIE).

Step (6): as shown in FIG. 1, a metal connection member 500 is manufactured on the connection portion 271 and the bonding layer 400 so as to allow the electrode connection pad layer 270 to be electrically connected to the electrical contact area 310. The metal connection member 500 may be a patterned Al electrode, and the metal connection member 500 may be solder pad, a lead wire, or a solder ball.

Furthermore, before the metal connection member 500 is manufactured, a dielectric layer may be manufactured in advance for electrical isolation. The dielectric layer may adopt inorganic dielectric materials such as silicon dioxide ($SiO_2$), silicon nitride ($Si_3N_4$), and the like, or may adopt organic dielectric materials such as polyimide (PI), benzocyclobutene (BCB), and the like.

While the instant disclosure has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. An integrated package method for MEMS element and ASIC chip, the integrated package method comprising:
   applying a lithographic process on an ASIC wafer to deposit and form a re-layout layer;
   spin-coating an organic compound layer on the re-layout layer to form a bonding layer, and applying the lithography process to the bonding layer to form a microcavity array;
   aligning and bonding an electrode connection pad layer on a front surface of an MEMS element with the microcavity array to form a closed cavity structure;
   thinning and polishing a silicon substrate on a back surface of the MEMS element being bonded to a desired thickness;
   applying the lithographic process on the MEMS element to form a connection portion outwardly protruding from the electrode connection pad layer, and forming an open hole on the bonding layer to expose an electrical contact area of the re-layout layer; and
   manufacturing a metal connection member on the connection portion and the bonding layer so as to allow the electrode connection pad layer to be electrically connected to the electrical contact area.

2. The integrated package method according to claim 1, wherein the MEMS element is an ultrasonic sensor, a bulk acoustic wave sensor, or a piezoelectric energy storage device.

3. The integrated package method according to claim 1, wherein in the MEMS element, the silicon substrate is stacked on an oxidation layer, the oxidation layer is staked on a lower electrode layer, the lower electrode layer is stacked on a piezoelectric layer, the piezoelectric layer is stacked on an upper electrode layer, the upper electrode layer is stacked on a surface passivation layer, and the surface passivation layer is stacked on the electrode connection pad layer.

4. The integrated package method according to claim 1, wherein the re-layout layer is an aluminum (Al) layer, a copper (Cu) layer, or an aluminum copper alloy (Al/Cu) layer.

5. The integrated package method according to claim 1, wherein the bonding layer is made of benzocyclobutene (BCB).

6. The integrated package method according to claim 1, wherein the closed cavity structure is a vacuum closed cavity.

7. The integrated package method according to claim 1, wherein in the step of thinning and polishing a silicon substrate on a back surface of the MEMS element being bonded to a desired thickness, the desired thickness is less than or equal to 10 μm.

8. The integrated package method according to claim 1, wherein the electrode connection pad layer is an aluminum (Al) layer, a copper (Cu) layer, or an aluminum cooper alloy (Al/Cu) layer.

9. The integrated package method according to claim 1, wherein the metal connection member is a solder pad, a lead wire, or a solder ball.

* * * * *